United States Patent
Darolia et al.

(10) Patent No.: US 8,100,083 B2
(45) Date of Patent: Jan. 24, 2012

(54) PROCESS AND APPARATUS FOR DEPOSITING A CERAMIC COATING

(75) Inventors: Ramgopal Darolia, West Chester, OH (US); Irene Spitsberg, Export, PA (US); Brett Allen Rohrer Boutwell, West Chester, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/883,386

(22) Filed: Sep. 16, 2010

(65) Prior Publication Data
US 2011/0003075 A1    Jan. 6, 2011

Related U.S. Application Data

(62) Division of application No. 10/707,469, filed on Dec. 16, 2003, now Pat. No. 7,824,744.

(51) Int. Cl.
*C23C 16/00* (2006.01)
(52) U.S. Cl. .............. 118/723 EB; 427/249.17
(58) Field of Classification Search ............ 118/723 EB; 427/249.17
See application file for complete search history.

(56) References Cited

U.S. PATENT DOCUMENTS

| 2003/0129316 A1* | 7/2003 | Darolia et al. ............... 427/402 |
| 2003/0129378 A1* | 7/2003 | Movchan et al. .......... 428/307.3 |

* cited by examiner

*Primary Examiner* — Keath Chen
(74) *Attorney, Agent, or Firm* — William Scott Anbes; Gary M. Hartman; Domenica N. S. Hartman

(57) ABSTRACT

A process and apparatus for depositing a ceramic coating, such as a thermal barrier coating (TBC) for a gas turbine engine component. The process deposits a coating whose composition includes multiple oxide compounds and a carbon-based constituent, e.g., elemental carbon, carbides, and carbon-based gases. The process uses at least one evaporation source to provide multiple different oxide compounds and at least one carbide compound comprising carbon and an element. The evaporation source is evaporated to produce a vapor cloud that contacts and condenses on the component surface to form the ceramic coating, and particularly so that the coating comprises the oxide compounds, an oxide of the element of the carbide compound, and the carbide compound and/or a carbon-containing gas. The process is carried out with an apparatus comprising a coating chamber in which the evaporation source is present, and a device for evaporating the evaporation source.

12 Claims, 1 Drawing Sheet

US 8,100,083 B2

PROCESS AND APPARATUS FOR DEPOSITING A CERAMIC COATING

CROSS REFERENCE TO RELATED APPLICATIONS

This is a division patent application of co-pending U.S. patent application Ser. No. 10/707,469, filed Dec. 16, 2003.

BACKGROUND OF THE INVENTION (1) Field of the Invention

The present invention generally relates to coating processes. More particularly, this invention is directed to a physical vapor deposition process and apparatus for depositing ceramic coatings containing multiple oxides and elemental carbon and/or a carbon-based gas.

(2) Description of the Related Art

Certain components of the turbine, combustor and augmentor sections of a gas turbine engine are typically protected from their harsh thermal environments by a thermal barrier coating (TBC) formed of a ceramic material. Various ceramic materials have been proposed for TBC's, the most notable of which is zirconia ($ZrO_2$) that is partially or fully stabilized by yttria ($Y_2O_3$). Binary yttria-stabilized zirconia (YSZ) is widely used as a TBC material because of its high temperature capability, low thermal conductivity and erosion resistance in comparison to zirconia stabilized by other oxides. YSZ is also preferred as a result of the relative ease with which it can be deposited by plasma spraying, flame spraying and physical vapor deposition (PVD) techniques. TBC's employed in the highest temperature regions of gas turbine engines are often deposited by PVD, particularly electron beam physical vapor deposition (EBPVD), which yields a columnar, strain-tolerant grain structure that is able to expand and contract without causing damaging stresses that lead to spallation. Similar columnar microstructures can be produced using other atomic and molecular vapor processes, such as sputtering (e.g., high and low pressure, standard or collimated plume), ion plasma deposition, and all forms of melting and evaporation deposition processes (e.g., cathodic arc, laser melting, etc.).

In order for a TBC to remain effective throughout the planned life cycle of the component it protects, it is important that the TBC material has and maintains a low thermal conductivity. However, the thermal conductivity of YSZ is known to increase over time when subjected to the operating environment of a gas turbine engine. To reduce and stabilize the thermal conductivity of YSZ, ternary YSZ systems have been proposed. For example, commonly-assigned U.S. Pat. No. 6,586,115 to Rigney et al. discloses a TBC of YSZ alloyed to contain certain amounts of one or more alkaline-earth metal oxides (magnesia (MgO), calcis (CaO), strontia (SrO) and barium oxide (BaO)), rare-earth metal oxides (lanthana ($La_2O_3$), ceria ($CeO_2$), neodymia ($Nd_2O_3$), gadolinium oxide ($Gd_2O_3$) and dysprosia ($Dy_2O_3$)), and/or such metal oxides as nickel oxide (NiO), ferric oxide ($Fe_2O_3$), cobaltous oxide (CoO), and scandium oxide ($Sc_2O_3$). According to Rigney et al., when present in sufficient amounts these oxides are able to significantly reduce the thermal conductivity of YSZ by increasing crystallographic defects and/or lattice strains. In commonly-assigned U.S. patent application Ser. No. 10/064,785 to Darolia et al., a TBC of YSZ is deposited to contain a third oxide, elemental carbon, and potentially carbides. The resulting TBC is characterized by lower thermal conductivity that remains more stable during the life of the TBC as a result of stable porosity that forms when the elemental carbon and carbides within the TBC oxidize to form carbon-containing gases (e.g., CO).

While the incorporation of additional oxides and carbon-containing compounds into a YSZ TBC in accordance with Rigney et al. and Darolia et al. has made possible a more stabilized TBC microstructures, it can be difficult to deposit a TBC by an evaporation process to produce a desired and uniform composition if the additional oxide has a significantly different vapor pressure (e.g., an order of magnitude) than zirconia and yttria. For example, co-evaporation of YSZ and zirconium carbide (ZrC) as a source of carbides and/or carbon is complicated by the low partial pressure of ZrC, yielding a TBC that has an unacceptable nonuniform distribution of carbides. To avoid this result, separate ingots of YSZ and ZrC may be evaporated with a single electron beam using a controlled beam jumping technique, with the dwell time on each ingot being adjusted so that the energy output achieves the energy balance required to obtain compositional control of the vapor cloud that condenses on the targeted surface to form the desired coating. Alternatively, multiple electron guns can be operated at power levels suited for the particular material being evaporated by a given gun. Yet another approach disclosed in commonly-assigned U.S. patent application Ser. No. 10/064,887 to Movchan et al. involves regulating when vapors from one or more evaporation sources are permitted to condense on the surface being coated, such that deposition only occurs while the relative amounts of vapors within the vapor cloud are at levels corresponding to the desired coating composition.

It would be desirable if a process existed that simplified the co-evaporation of materials with different vapor pressures during the deposition of TBC's and other coatings.

BRIEF SUMMARY OF THE INVENTION

The present invention provides a process and apparatus for depositing a ceramic coating, such as a thermal barrier coating (TBC) for a component intended for use in a hostile thermal environment, particular examples of which include turbine, combustor and augmentor components of a gas turbine engine. The process of this invention is particularly directed to an evaporation technique for depositing a TBC whose composition includes multiple oxide compounds and a carbon-based constituent, which as used herein includes elemental carbon, carbides, and carbon-based gases such as carbon monoxide (CO) and carbon dioxide ($CO_2$).

The invention generally entails the use of at least one evaporation source so as to provide multiple different oxide compounds and at least one carbide compound comprising carbon and an element. The evaporation source is evaporated to produce a vapor cloud that contacts and condenses on a surface to form a ceramic coating that comprises the oxide compounds, an oxide of the element of the carbide compound, and at least one of elemental carbon, a carbon-containing gas, and precipitates of the carbide compound. Such a process can be carried out with an apparatus comprising a coating chamber in which the one or more evaporation sources are present, and means for evaporating the evaporation source(s) to produce a vapor cloud that contacts and condenses on the surface to form the ceramic coating.

According to one aspect of the invention, the process is particularly suited for use when the oxide of the carbide compound element has a vapor pressure that is significantly different from the oxide compounds. If a YSZ coating is to be deposited, particularly notable examples of such oxides include ytterbia, neodymia, and lanthana, each of which has a sufficient absolute percent ion size difference relative to zirconium ions to produce significant lattice strains that promote lower thermal conductivities. As a result of their significantly different vapor pressures, it is difficult to produce a ceramic coating having a uniform and desired composition by simultaneously evaporating one or more ingots of YSZ and any one or more of these oxides. In accordance with this invention, these oxides can be codeposited with YSZ by evaporating their corresponding carbides, i.e., $YbC_2$, $NdC_2$, and $LaC_2$, which dissociate during evaporation to form the oxide if sufficient oxygen is present within the vapor cloud to oxide the metal dissociated from the carbide. Furthermore, the process of this invention also advantageously co-deposits one or more carbon-based constituents that also evolve from evaporation of the carbide(s), promoting stable porosity within the coating.

Other objects and advantages of this invention will be better appreciated from the following detailed description.

DETAILED DESCRIPTION OF THE INVENTION

Figure 1:
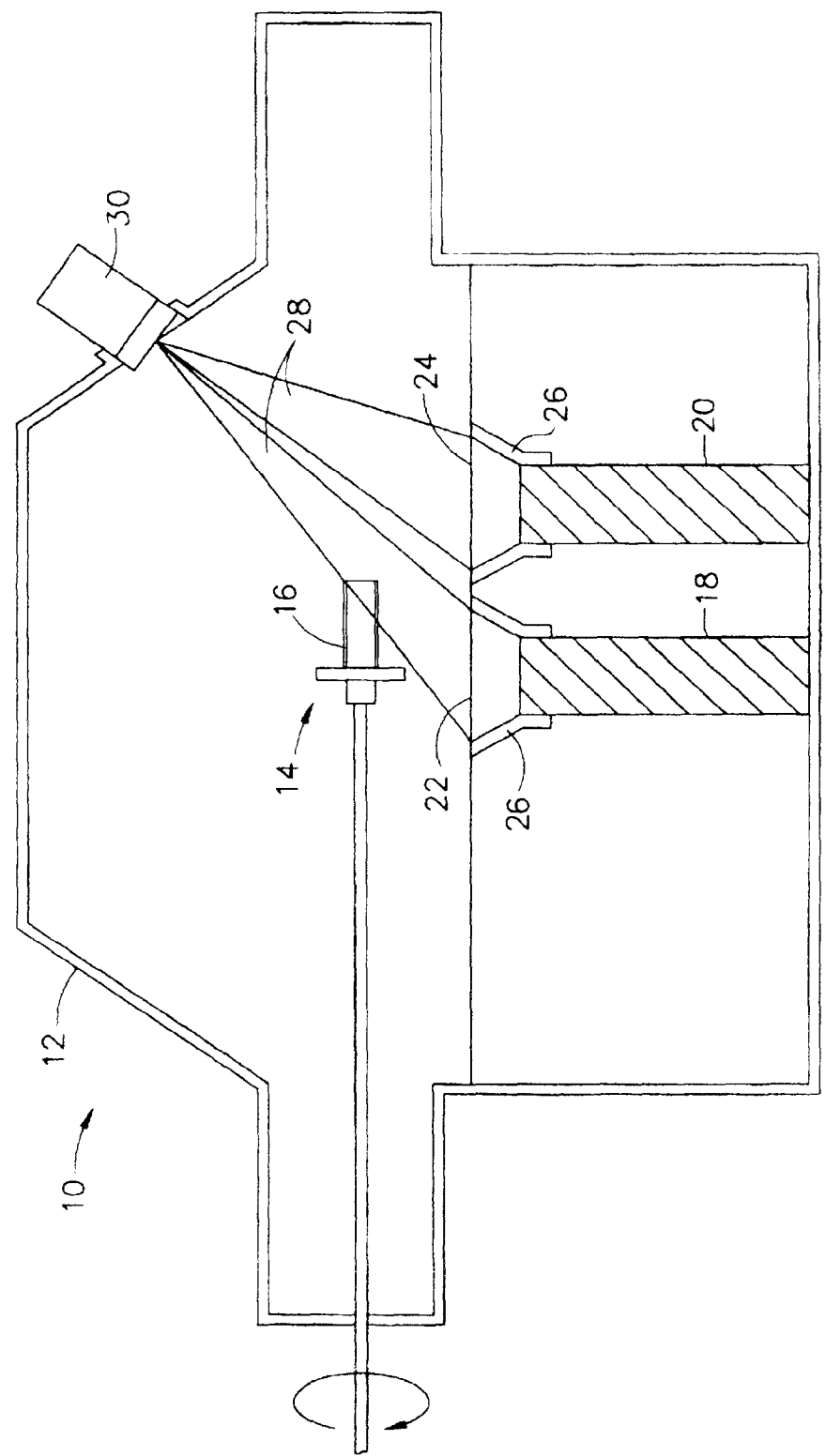
FIG. 1 is a schematic representation of an EBPVD apparatus using multiple evaporation sources to deposit a ceramic coating containing multiple oxide compounds, one of which has a significantly different vapor pressure than the remaining oxide compounds of the coating, in accordance with an embodiment of the present invention.

The present invention is generally applicable to components subjected to high temperatures, and are therefore often formed of a superalloy material. The advantages of this invention are particularly applicable to TBC's for gas turbine engine components, such as the high and low pressure turbine nozzles and blades, shrouds, combustor liners and augmentor hardware. However, the teachings of this invention are more generally applicable to processes and apparatuses for depositing a ceramic coating. To provide the required thermal protection for a particular component, TBC's are typically deposited to a thickness of about 75 to about 300 micrometers, though lesser and greater thicknesses are foreseeable. Adhesion of the TBC to a superalloy substrate is typically promoted with the use of a bond coat, preferably an aluminum-rich composition such as an overlay coating of beta-phase NiAl intermetallic or MCrAlX alloy or a diffusion aluminide coating, though it is foreseeable that other bond coat materials and types could be used. These aspects of the invention are generally well known in the art, and therefore will not be discussed in further detail.

To achieve a strain-tolerant columnar grain structure, TBC's are deposited using a physical vapor deposition technique, such as EBPVD, though other evaporation techniques are possible and within the scope of this invention. The EBPVD process requires the presence of at least one evaporation source of the coating composition desired, and an electron beam at an appropriate power level to create a vapor of the evaporation source in the presence of the surface to be coated. FIG. 1 schematically represents a portion of an EBPVD coating apparatus 10, including a coating chamber 12 in which a component 14 is suspended for coating. A TBC 16 is represented as having been deposited on the component 14 as a result of melting and vaporizing a pair of ingots 18 and 20 that, in combination, provide the constituents of the desired coating material. The ingots 18 and 20 are depicted as being evaporated with electron beams 28 produced by a single electron beam gun 30, though multiple guns could be used for this purpose. The intensities of the beams 28 are sufficient to produce a vapor cloud that contacts and then condenses on the component 14 to form the TBC 16. The vapor cloud evaporates from pools 22 and 24 of molten ingot material contained within reservoirs formed by crucibles 26 that surround the upper ends of the ingots 18 and 20.

According to a preferred aspect of the invention, the thermal-insulating material of the TBC 16 is based on binary yttria-stabilized zirconia (preferably zirconia stabilized by about 3 to about 8 weight percent yttria), and further alloyed to contain at least a third metal oxide. The invention particularly pertains to the deposition by evaporation of YSZ-based coatings in which one or more of the additional metal oxides have a vapor pressure that differs significantly from zirconia and yttria, defined herein as at least an order of magnitude higher or lower than zirconia and yttria. Though not a necessary feature of the invention, the third oxide preferably has the effect of reducing and/or stabilizing the thermal conductivity of the TBC 16. For this purpose, and in accordance with commonly-assigned U.S. Pat. No. 6,586,115 to Rigney et al., the third oxide preferably has a sufficient absolute percent ion size difference relative to zirconium ions to produce significant lattice strains that promote lower thermal conductivities. In accordance with commonly-assigned U.S. patent application Ser. No. 10/064,785 to Darolia et al., the TBC 16 also contains entrapped carbon-containing gases (e.g., carbon monoxide (CO) and/or carbon dioxide ($CO_2$)) and possibly elemental carbon and/or carbides in the form of precipitate clusters, the thermal decomposition of which yields additional carbon-containing gas. In combination, the presence of entrapped CO and/or $CO_2$, elemental carbon and/or carbide clusters, and one or more of the above-specified third metal oxides are believed to reduce the density and thermal conductivity of the YSZ TBC 16.

According to the present invention, the ingots 18 and 20 can be evaporated to simultaneously deposit YSZ (or another base material), the third oxide, and the carbon-based constituent(s) in controllable desired proportions as a result of the third oxide and the carbon-based constituent(s) evolving during evaporation from a carbide of the metallic component of the third oxide. In preferred examples, one or more oxides of ytterbium, neodymium, and lanthanum ($Yb_2O_3$, $Nd_2O_3$, and $La_2O_3$) are co-deposited with YSZ by simultaneously evaporating the ingots 18 and 20, one of which may be formed of YSZ while the other may be formed of one or more of $YbC_2$, $NdC_2$, and $LaC_2$. During evaporation, the carbide dissociates and the dissociated metal oxidizes to deposit as the desired oxide on the component 14 to form the TBC 16. In so doing, elemental carbon released as a result of dissociation of the carbide (and possibly the carbide itself) also deposits within the TBC 16. During deposition, the third oxide preferably solutions into the YSZ to increase crystallographic defects and/or lattice strains that reduce thermal conductivity of the TBC 16.

In accordance with Darolia, the presence of elemental carbon and/or carbide precipitates within the TBC 16 increases the porosity of the TBC 16 apparently as a result of a shadowing effect that occurs when two insoluble phases are deposited by PVD. More particularly, "primary" porosity is believed to be created surrounding deposited elemental carbon clusters (and possibly clusters of carbides, oxycarbides, etc., all of which are insoluble in YSZ) during EBPVD as a result of zirconia vapor flux being blocked from the immediate vicinity of the second phase clusters. Another benefit of co-deposition of carbon clusters (and possibly carbide clusters) by EBPVD has been observed to be the formation of many additional interfaces associated with sub-grain boundaries, possibly due to what appears to be related to the presence of carbon promoting the nucleation of new sub-grains and inhibiting diffusion processes of grain growth. The result is a continuous nucleation of new grains, which produces a fine sub-grained TBC structure with numerous interfaces that reduce thermal conductivity through the TBC grains. Open porosity levels observed within TBC deposited in accordance with this invention are well in excess of TBC deposited under identical conditions from only a YSZ source.

Fine "secondary" porosity occurs as a result of elemental carbon (and possibly carbides) precipitates within the TBC 16 reacting with oxygen to form carbon monoxide and/or another carbon-containing gas (e.g., carbon dioxide) during high temperature excursions (e.g., above about 950° C.). As a result of the primary porosity surrounding the deposited carbon, there is sufficient pore volume for carbon-containing gases to evolve and produce very fine pores ("micropores") within the TBC 16. As these gases form and some of the original primary porosity is lost as a result of shrinkage of smaller pores and growth of larger pores at the expense of smaller pores (pore coarsening and redistribution) during sintering, some of the gases are entrapped within the micropores. The entrapped gases are believed to counteract surface tension energies that are the driving force for the shrinkage of small pores during sintering. Therefore, in addition to reducing the density and thermal conductivity of the TBC 16, the added fine porosity is thermally stable, i.e., less susceptible to shrinkage.

While not wishing to be held to any particular theory, the above-noted carbides are believed to provide a source of carbon within the slightly oxidizing atmosphere maintained within the EBPVD chamber 12 as a result of a controlled amount of oxygen being introduced into the chamber 12 above that necessary to ensure the deposition of $ZrO_2$. Using the neodymium-based carbide ($NdC_2$) as an example, the coating reaction is believed to be:

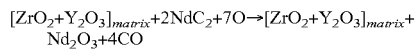

$$[ZrO_2+Y_2O_3]_{matrix}+2NdC_2+7O \rightarrow [ZrO_2+Y_2O_3]_{matrix}+Nd_2O_3+4CO$$

In this reaction, carbon monoxide is indicated as evolving during dissociation of neodymium carbide ($NdC_2$), so as to be co-deposited with YSZ and neodymia ($Nd_2O_3$). In addition or alternatively, clusters of elemental carbon and/or neodymium carbide may be co-deposited with YSZ, such that primary porosity forms around these clusters as a result of the shadowing effect during the EBPVD process. During subsequent heating, gaseous carbon monoxide then forms in situ as a result of oxidation of the carbon and/or neodymium carbide, resulting in new secondary porosity within the TBC 16 and its grains, as well as carbon monoxide (and/or carbon dioxide or another carbon-containing gas) entrapped within micropores that are remnants of the original primary porosity. Oxycarbides are also potential byproducts of the above reaction, and may serve to stabilize the micropore structure of the TBC 16 by anchoring and pinning the grain boundaries and pores of the TBC 16.

If a significant amount of carbon monoxide forms as a result of oxidation of carbide precipitates within the TBC 16, the carbides of the Group III metals of the Periodic Table can be more beneficial as compared to other carbides, such as ZrC, as these carbides tend to be relatively less stable. The basis for this belief is that carbide stability correlates with melting point, ZrC has a melting point of about 3427° C., while the melting points of the Group III carbides are believed to be in the range of about 2215° C. to about 2500° C. During the transformation of the carbide into the third oxide, a volume change is likely to occur that may lead to the formation of additional porosity during aging of the TBC 16. For obtaining this benefit, the carbides of lanthanum, tantalum and neodymium are believed to be preferred as a result of their oxides being about 50 volume percent smaller than their carbides.

Additional benefits are possible with the present invention by co-evaporating carbides having vapor pressures and evaporation rates similar to zirconia, such that the evaporation process can be more readily controlled to yield a desired composition. For example, ZrC has a vapor pressure of one order of magnitude lower than $ZrO_2$ in the temperature range of 2500° C. to 3000° C., which appears to correlate with their different melting points (about 2701° C. for $ZrO_2$ and about 3427° C. for ZrC). As noted above, the melting points of carbides of the Group III metals are comparable to that of zirconia, such that the vapor pressures of these carbides are closer to zirconia than ZrC (i.e., less than one order of magnitude), making co-evaporation of zirconia and one or more of these carbides easier than co-evaporation of zirconia and ZrC. Such circumstances permit the carbide and zirconia (along with yttria) to be contained within a single ingot, so that multiple ingots are not required to deposit the TBC 16.

While the invention has been described in terms of a preferred embodiment, it is apparent that other forms could be adopted by one skilled in the art. For example, instead of depositing the TBC by EBPVD, other vapor deposition processes could be used. Accordingly, the scope of the invention is to be limited only by the following claims.

The invention claimed is:

1. An apparatus for depositing a ceramic coating on a surface, the apparatus comprising:
   a coating chamber;
   at least one evaporation source that provides multiple different oxide compounds and at least one carbide compound chosen from the group consisting of $YbC_2$, $NdC_2$, and $LaC_2$; and
   means for evaporating the at least one evaporation source to produce a vapor cloud that contacts and condenses on the surface to form the ceramic coating.

2. An apparatus according to claim 1, wherein the oxide compounds are yttria and zirconia and are present in the at least one evaporation source as yttria-stabilized zirconia.

3. An apparatus according to claim 2, wherein the at least one carbide compound has a vapor pressure within one order of magnitude of the vapor pressure of zirconia.

4. An apparatus according to claim 1, wherein the at least one evaporation source comprises two evaporation sources, the oxide compounds are present within a first of the evaporation sources, and the at least one carbide compound is present within a second of the evaporation sources.

5. An apparatus according to claim 4, wherein the first evaporation source consists of the oxide compounds and the second evaporation source consists of the at least one carbide compound.

6. An apparatus according to claim 1, wherein the at least one evaporation source consists of a single evaporation source, and the oxide compounds and the at least one carbide compound are present within the single evaporation source.

7. An electron-beam physical vapor deposition apparatus for depositing a ceramic coating on a component, the apparatus comprising:
   a coating chamber in which the component is suspended;
   at least one ingot that provides zirconia, yttria, and at least one carbide compound as evaporation sources within the coating chamber, the at least one carbide compound being chosen from the group consisting of $YbC_2$, $NdC_2$, and $LaC_2$; and a high-energy beam projected on the at least one ingot; and a vapor cloud within the coating chamber as a result of evaporation of the at least one ingot by the high-energy beam, the vapor cloud contacting and condensing on the component to form the ceramic coating, the ceramic coating comprising yttria-stabilized zirconia, at least one oxide formed by oxidation of ytterbia, neodymia and/or lanthanum present as a result of dissociation of the at least one carbide compound, and a uniform distribution of at least one of elemental carbon and CO.

8. An apparatus according to claim 7, wherein yttria and zirconia are present in the at least one evaporation source as yttria-stabilized zirconia.

9. An apparatus according to claim 7, wherein the carbide compound has a vapor pressure within one order of magnitude of the vapor pressure of zirconia.

10. An apparatus according to claim 7, wherein the at least one ingot comprises two ingots, yttria and zirconia are present within a first of the ingots, and the at least one carbide compound is present within a second of the ingots.

11. An apparatus according to claim 10, wherein the first ingot consists of yttria and zirconia and the second ingot consists of the at least one carbide compound.

12. An apparatus according to claim 7, wherein the at least one ingot consists of a single ingot, and yttria, zirconia and the at least one carbide compound are present within the single ingot.

* * * * *